(12) United States Patent
Iwai et al.

(10) Patent No.: US 8,657,955 B2
(45) Date of Patent: Feb. 25, 2014

(54) MELT COMPOSITION FOR GALLIUM NITRIDE SINGLE CRYSTAL GROWTH AND METHOD FOR GROWING GALLIUM NITRIDE SINGLE CRYSTAL

(75) Inventors: Makoto Iwai, Kasugai (JP); Takanao Shimodaira, Nagoya (JP); Yoshihiko Yamamura, Nagoya (JP); Takatomo Sasaki, Suita (JP); Yusuke Mori, Suita (JP); Fumio Kawamura, Suita (JP); Shiro Yamasaki, Nishikasugai-Gun (JP)

(73) Assignees: NGK Insulators, Ltd, Nagoya (JP); Osaka University, Suita (JP); Toyoda Gosei Co., Ltd., Nishikasugai-Gun (JP)

( * ) Notice: Subject to any disclaimer, the term of this patent is extended or adjusted under 35 U.S.C. 154(b) by 1179 days.

(21) Appl. No.: 12/462,429

(22) Filed: Aug. 3, 2009

(65) Prior Publication Data

US 2009/0293805 A1     Dec. 3, 2009

Related U.S. Application Data

(63) Continuation of application No. PCT/JP2008/051892, filed on Jan. 30, 2008.

(30) Foreign Application Priority Data

Feb. 15, 2007  (JP) .................................. 2007-035059

(51) Int. Cl.
   *C30B 11/02*     (2006.01)
(52) U.S. Cl.
   USPC .................................. 117/81; 117/82; 117/83

(58) Field of Classification Search
   USPC ................................................. 117/81, 82, 83
   See application file for complete search history.

(56) References Cited

U.S. PATENT DOCUMENTS

| 5,868,837 | A  | * | 2/1999 | DiSalvo et al. ................. 117/2 |
| 6,949,140 | B2 | * | 9/2005 | Sarayama et al. ............... 117/81 |
| 7,507,292 | B2 | * | 3/2009 | Sasaki et al. ................... 117/73 |
| 2005/0048686 | A1 | * | 3/2005 | Kitaoka et al. ................. 438/46 |
| 2005/0082564 | A1 | * | 4/2005 | Kitaoka et al. ............... 257/103 |
| 2006/0051942 | A1 |  | 3/2006 | Sasaki et al. |
| 2007/0196942 | A1 |  | 8/2007 | Kitaoka et al. |

FOREIGN PATENT DOCUMENTS

| JP | 2006-265069 A1 | 10/2006 |
| WO | 2004/013385 A1 | 2/2004 |
| WO | 2004/067814 A1 | 8/2004 |
| WO | 2005/064661 A1 | 7/2005 |
| WO | 2006/095536 A1 | 9/2006 |

OTHER PUBLICATIONS

Masanori Morishita et al., "*Growth of Bulk GaN Single Crystals Using Li-Na Mixed Flux System*," Japan Journal of Applied Physics, vol. 42 (2003), pp. L565-L567.

S. Fujisaki et al., "*Characterization of GaN Single Crystals Grown by Li added Na-Flux Method*," 7a-X-7, Conference Proceedings I, 66th Autumn Meeting, The Japan Society of Applied Physics, p. 258.

* cited by examiner

*Primary Examiner* — Bob M Kunemund
(74) *Attorney, Agent, or Firm* — Burr & Brown, PLLC

(57) ABSTRACT

It is provided a melt composition for growing a gallium nitride single crystal by flux method. The melt composition contains gallium, sodium and barium, and a content of barium is 0.05 to 0.3 mol % with respect to 100 mol % of sodium.

2 Claims, 9 Drawing Sheets
(8 of 9 Drawing Sheet(s) Filed in Color)

MELT COMPOSITION FOR GALLIUM NITRIDE SINGLE CRYSTAL GROWTH AND METHOD FOR GROWING GALLIUM NITRIDE SINGLE CRYSTAL

BACKGROUND OF THE INVENTION

1. Field of the Invention

The present invention relates to a melt composition used for growth of a gallium nitride single crystal and a method for growing a gallium nitride single crystal.

2. Description of Related Art

Gallium nitride has been attracting a great deal of attention as a superior blue light emitting diode, and has been practically used in material for a light emitting diode or a semiconductor laser diode. In recent years, a method for growing a gallium nitride single crystal from a melt by flux method has been receiving particular attention.

International Publication No. WO 2004/013385 A1 discloses that GaN single crystals are grown using a melt composition of a Ga—Na-A (Li, K, Rb, Cs, Fr)—B (Ca, Sr, Ba, Ra) system by flux method. In this regard, however, one or more element(s) are selected from at least one of the A group elements or the B group elements.

Further, International Publication No. WO 2004/067814 A1 discloses that GaN single crystals are grown using a melt composition of a Ga—Li-A (Na, K, Rb, Cs, Fr)—B (Ca, Sr, Ba, Ra) system by the flux method. In this regard, however, one or more element(s) are selected from at least one of the A group elements or the B group elements.

Still further, U.S. Pat. No. 5,868,837 discloses growth of GaN single crystals using a melt composition of a Ga—Na-A (A represents a small amount of alkaline earths) system by means of the flux method. An additive amount of the alkaline earths is defined such that 0.002 to 0.05 mol is contained per 1 molar quantity of Ga. Strontium is used in Example 2, while barium is used in Example 3. In each of the Examples, an inner lining composed of tungsten is provided on the interior of a pressure-resistant vessel formed of stainless steel, and raw materials are charged therein.

In growth of GaN crystals by means of Na flux method, addition of Li to a melt has been known for increasing flatness or transparency of the crystals (Jpn. J. Appl. Phys. 42 (2003) L565).

Further, it is also known that when an additive amount of Li is greater, Li is introduced into the GaN crystals (Conference Proceedings I, 7a-X-7, the $66^{th}$ Autumn Meeting, 2005, The Japan Society of Applied Physics). Such introduction of Li into the GaN single crystals will result in an increase of impurity band emission having a central wavelength of approximately 511 nm when the PL (Photo Luminescence) or CL (Cathode Luminescence) is measured.

SUMMARY OF THE INVENTION

The inventors have studied a variety of elements to find an additive metal element as an alternative to Li used for growth of GaN single crystals using a melt of a Ga—Na system by flux method. As a result, when calcium belonging to an alkali metal element was added, it was observed that blue-color light was emitted from the crystals whose color was gray and transparent, and also observed that an alumina crucible was heavily corroded. On the other hand, when strontium was added, the alumina crucible was also corroded but the extent of corrosion thereof was less than that of calcium. Further, as was expected, yellow-green light emitted from the crystal was observed. When barium was added, almost no corrosion was found in the alumina crucible. In addition, impurity band emission was barely observed in the obtained GaN single crystals.

It is an object of the present invention is to reduce impurity band emission from a GaN single crystal to thereby obtain the crystal having a high degree of transparency, when the crystal is grown using a melt of a Ga—Na system by flux method.

The present invention provides a melt composition for growing a gallium nitride single crystal by a flux method, the melt composition comprising gallium, sodium and barium, wherein a content of barium is 0.05 to 0.3 mol % with respect to 100 mol % of sodium.

In addition, the present invention relates to a method for growing the gallium nitride single crystal from the melt composition set forth above using the flux method.

According to the present invention, it is not only possible to obtain a relatively colorless GaN single crystal but also possible to remarkably reduce unnecessary light emission caused by introduction of an impurity element into the single crystal.

For example, among lithium, calcium, and strontium elements belonging to alkali metal or alkali earth metal elements, when calcium is added to a Ga—Na melt, impurity band emission of blue light is observed. On the other hand, when strontium is added to the melt of the Ga—Na system, impurity band emission of yellow-green light is observed. This emission is similar to that obtained when lithium is added. Further, even when single crystals are grown from a Ga—Na melt (including no added metal), blue light emission is also observed in the obtained single crystals. From the above-described findings, it has been difficult to predict that light emitted from GaN single crystals can be remarkably reduced when barium is added to the melt of the Ga—Na system as achieved in the present invention.

When an amount of sodium in the melt is taken as 100 mol %, the number of moles of barium is preferably 0.05 mol % or greater, and more preferably 0.1 mol % or greater. In addition, the number of moles of barium is 0.3 mol % or smaller, and preferably 0.27 mol % or smaller. If the amount of barium is excessively small with respect to the amount of sodium, it becomes hard to attain the above-described effect of reducing impurity band emission. An excessively great amount of barium causes multinucleation to easily occur, which makes it difficult to obtain crystals with excellent quality.

BRIEF DESCRIPTION OF THE DRAWINGS

The patent or application file contains at least one drawing executed in color. Copies of this patent or patent application with color drawing(s) will be provided by the Office upon request and payment of the necessary fee.

DETAILED DESCRIPTION OF THE INVENTION

Figure 1:
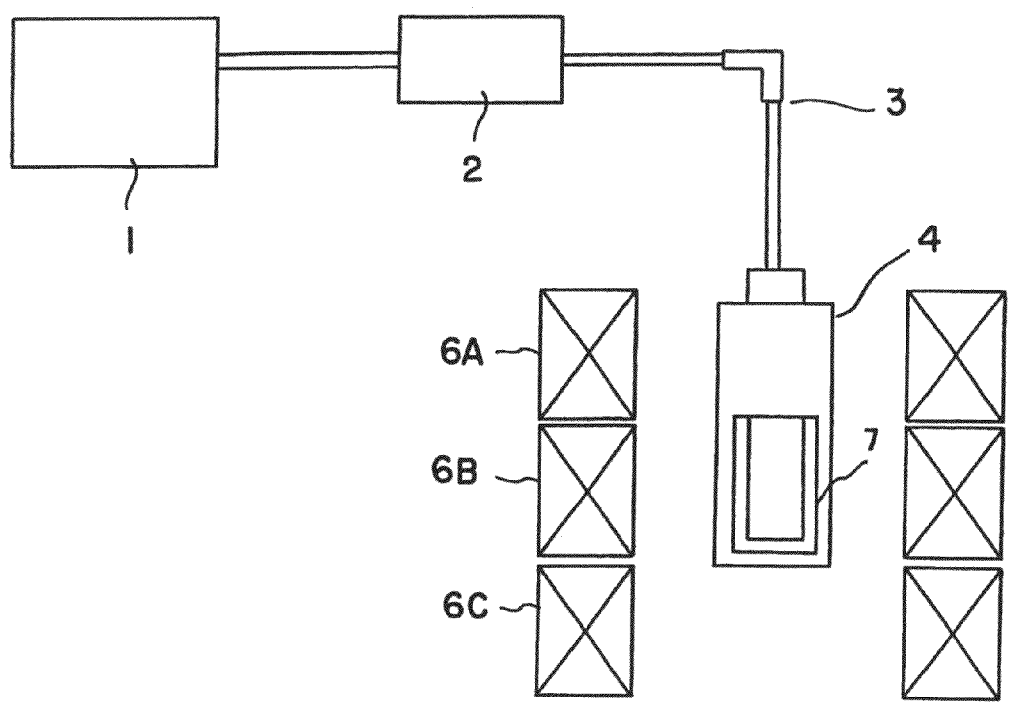
FIG. 1 is a block diagram schematically showing a growth apparatus which can be used to implement the present invention.

To produce a melt composition according to the present invention, a gallium raw material, a sodium raw material, and at least a barium raw material are mixed together to thereby melt the materials.

As the gallium raw material, a simple substance metal of gallium or a gallium alloy (for example, $Ga_4Na$) may be utilized, and the simple substance metal of gallium is preferable in terms of handling.

As the sodium raw material, a simple substance metal of sodium or a sodium alloy (for example, $Ga_4Na$) may be utilized, and the simple substance metal of sodium is preferable in terms of handling.

Barium, a simple substance metal of barium, a barium alloy (for example, $Ba_8Ga_7$, $BaGa_2$, $BaGa_4$, $Ba_{10}Ga$), and a barium compound (for example, $Ba_3N_2$) may be utilized, and the simple substance metal is preferable in terms of handling.

Mole fractions of gallium and sodium in the melt are not specifically limited. For example, when the amount of sodium is taken as 100 mol %, the number of moles of gallium is preferably 10 mol % or higher, more preferably 15 mol % or higher, and most preferably 20 mol % or higher. In addition, the number of moles of gallium is preferably 50 mol % or lower, and more preferably 40 mol % or lower.

Other than gallium, sodium and barium, a small amount of, for example, carbon, calcium, aluminum, indium, tin, zinc, bismuth, antimony, silicon, magnesium, and the like may be added to the melt.

The material should be resistant to conditions of heating and pressurization intended for quality of material of a growth vessel in which the melt is caused to react. Such a material includes a high-melting point metal such as tantalum metal, tungsten, or molybdenum; an oxide such as alumina, sapphire, yttria, or YAG ($Y_3Al_5O_{12}$); a nitride ceramics such as aluminum nitride, titanium nitride, zirconium nitride, or boron nitride; a refractory metal carbide such as tungsten carbide or tantalum carbide; and a pyrolysate such as p-BN (pyrolytic BN) or p-Gr (pyrolytic graphite). Among the above-listed materials, the use of alumina is most preferable from a practical standpoint of growing a large GaN single crystal of excellent crystallinity.

In implementation of the present invention, a raw material mixture is melted under an atmosphere including, for example, at least nitrogen gas and/or ammonia to generate a melt. Then, a predetermined condition for growing a single crystal is established. Although such a condition is not specifically limited, it is preferable to define a total pressure of the atmosphere as being 3 to 200 MPa. In addition, a growth temperature is defined to be preferably 800 to 1200° C., and more preferably 850 to 1000° C.

Gases other than nitrogen and ammonia in the atmosphere are not specifically limited, but may include preferably an inert gas, and particularly preferably argon, helium, and neon.

The material of a growth substrate for epitaxially growing a gallium nitride crystal may include, but not limited to, a GaN self-standing substrate; sapphire; an AlN template; a GaN template; a silicon single crystal; a SiC single crystal; an MgO single crystal; a spinelle ($MgAl_2O_4$); $LiAlO_2$; $LiGaO_2$; and a perovskite-type composite oxide such as $LaAlO_3$, $LaGaO_3$, $NdGaO_3$, or the like. Further, it is also possible to use a composite oxide having a cubic-system perovskite structure whose composition formula is $[A_{1-y}(Sr_{1-x}Ba_x)_y][Al_{1-z}Ga_z]_{1-u}D_u]O_3$ (where A is a rare earth element, D is at least one element selected from a group of niobium and tantalum, y=0.3 to 0.98, x=0 to 1, z=0 to 1, u=0.15 to 0.49, and x+z=0.1 to 2). Still further, SCAM ($ScAlMgO_4$) may be used.

The AlN template refers to those in which an AlN single crystal epitaxial thin film is formed on a sapphire single crystal substrate. The GaN template substrate refers to those in which a GaN single crystal epitaxial thin film is formed on a sapphire substrate. A film thickness of the template may be appropriately determined as long as it is greater than a film thickness with which the template will undergo meltback at the start of growth. The AlN template is more resistant to meltback as compared to the GaN template. Therefore, for example, the film thickness of the AlN template may be 1 micron or more, while that of the GaN template may be 3 micron or more.

In a single crystal growth apparatus, an apparatus for heating the raw material mixture in order to generate the melt is not specifically limited. The apparatus may preferably be a hot isostatic press apparatus, while other atmosphere pressurized heating furnaces may be used.

During production of the single crystal, for example, a plurality of heating elements 6A, 6B, and 6C are vertically arranged as schematically shown in FIG. 1, and calorific values are independently controlled for each of the heating elements. In other words, multizone control is performed along a vertical direction. Although it is generally difficult to control a temperature gradient in the vertical direction since internal temperature and pressure of the pressure vessel become high, temperature differences inside the melt can be optimally controlled by vertically arranging the plurality of heating elements and performing zone control for each of the heating elements.

While causing each heating element to generate heat, a nitrogen containing atmosphere is fed through a gas tank 1, a pressure controller 2, and a pipe 3 into a growth vessel 7 in an atmosphere controlling container 4, and heat and pressure are applied. As a result of the application of heat and pressure, all of mixture materials are melted inside the growth vessel to thereby generate the melt. Here, as long as the predetermined condition for growing the single crystal is maintained, nitrogen is stably fed into the melt of growth materials, so that a single crystal film is grown on a seed crystal.

The material of the heating elements includes, by way of illustration and not limited to, an alloy heating element such as an iron-chromium-aluminum system, a nickel-chromium system, or the like; a refractory metal heating element such as platinum, molybdenum, tantalum, tungsten, or the like; a non-metallic heating element such as silicon carbide, molybdenum silicide, carbon, or the like.

EXAMPLES

Example 1

In a glove box, 0.88 g (0.038 mol) of metallic sodium, 1 g (0.014 mol) (37 mol % with respect to 100 mol % of metallic sodium) of metallic gallium, and 16 mg (0.27 mol % with respect to 100 mol % of metallic sodium) of metallic barium were weighted. These raw materials were charged into an alumina crucible growth vessel having an inner diameter of φ17 mm. Then, a seed crystal substrate was placed on a bottom part of the crucible growth vessel 1. A GaN template substrate measuring 10 mm per side was used as the seed crystal substrate. The substrate was horizontally placed on the bottom of the crucible growth vessel with a single crystal thin film of the template being faced upward.

Figure 2:
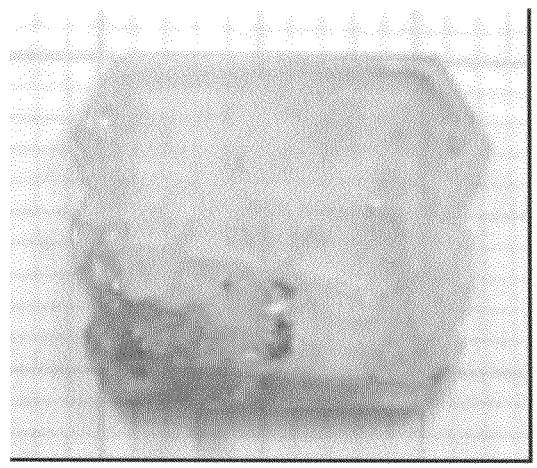
FIG. 2 is a photograph showing an appearance of GaN single crystals in Example 1 where barium is added.

Next, a crucible was set in the growth apparatus, which is pressurized to 3.5 MPa by means of nitrogen gas. The growth apparatus was kept at 870° C. for 100 hours to grow GaN single crystals. At this time, for mixing the melt, a rocking furnace was used with an oscillation cycle was set to 10 rpm, while an oscillation angle was set to 15 degrees. After natural cooling to room temperature, the crucible growth vessel was removed from the growth apparatus, and treated in ethanol to thereby melt Na and Ba. Subsequently, the crucible growth vessel was immersed in dilute hydrochloric acid to remove remaining Ga, and the GaN single crystals were drawn. The GaN single crystals had a roughly hexagonal shape of approximately 12 mm×12 mm, and were approximately 2 mm in thickness. The GaN single crystals were almost transparent and colorless. Neither cracks nor inclusion of other types of crystal macro defects were observed. A photograph of the GaN single crystals is shown in FIG. 2.

Figure 3:
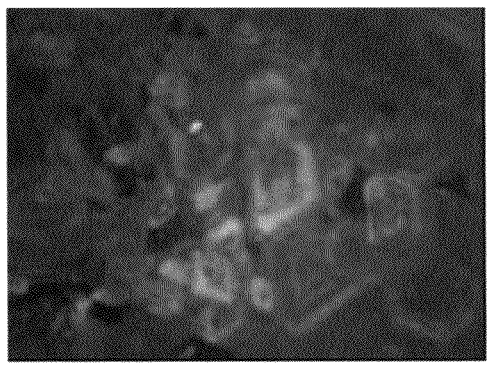
FIG. 3 is a fluorescence micrograph of the GaN single crystals in Example 1 where barium is added.

While irradiating the crystals with an ultraviolet lamp, only visible radiation was observed through an ultraviolet cut filter by means of a fluorescence microscope. The result of this observation is shown in FIG. 3. Noticeable light emission is not seen.

Comparative Example 1

Figure 4:
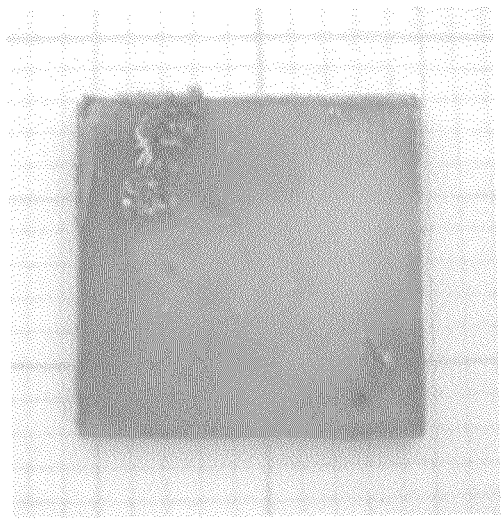
FIG. 4 is a photograph showing an appearance of GaN single crystals in Comparative Example 1 where lithium is added.
Figure 5:
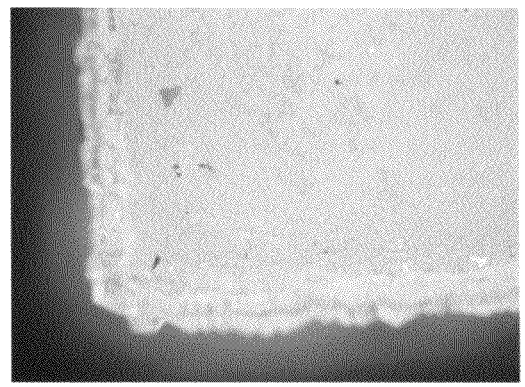
FIG. 5 is a fluorescence micrograph of the GaN single crystals in Comparative Example 1 where lithium is added.

GaN single crystals were grown in a manner similar to that of Example 1, except that instead of adding barium, 0.5 mol % of lithium was added with respect to 100 mol % of Na. The obtained GaN single crystals were almost identical in shape to the template, but slightly larger than the template. The dimensions of the crystals were approximately 11 mm×11 mm and approximately 0.6 mm in thickness. The crystals were slightly brown, but transparent. Neither cracks nor inclusion of other types of crystal macro defects were observed. FIG. 4 shows a photograph of the GaN single crystals. When the crystals were examined for impurity band emission by means of a fluorescence microscope as in the case of Example 1, emission of yellow-green light was observed (FIG. 5).

Comparative Example 2

Figure 6:
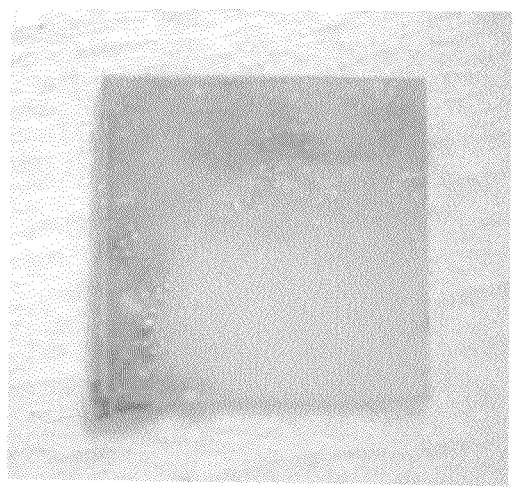
FIG. 6 is a photograph showing an exterior appearance of GaN single crystals in Comparative Example 2 where strontium is added.

GaN single crystals were grown in the manner similar to that of Example 1, except that instead of adding Ba, 0.27 mol % of Sr was added with respect to 100 mol % of Na. The obtained GaN single crystals, which were almost identical in shape to the template but slightly larger than the template, had dimensions of approximately 11 mm×11 mm and approximately 0.7 mm in thickness. The color was mostly gray other than an edge portion which was brown-tinted. Neither cracks nor inclusion of other types of crystal macro defects were observed. A photograph of the crystals is shown in FIG. 6.

Figure 7:
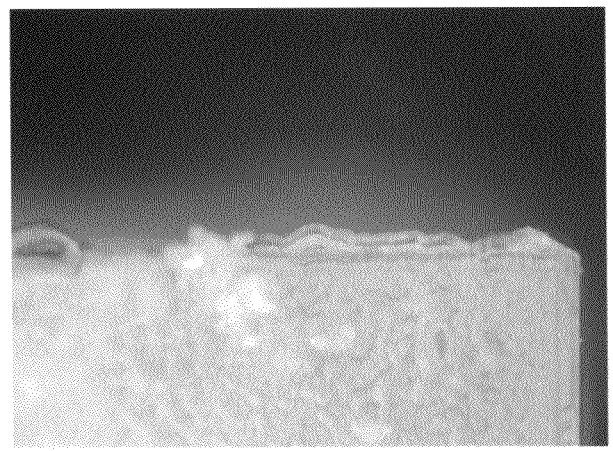
FIG. 7 is a fluorescence micrograph of the GaN single crystals in Comparative Example 2 where strontium is added.

When the crystals were similarly examined for impurity band emission by means of the fluorescence microscope, emission of yellow-green light was observed (FIG. 7). In addition, both the alumina crucible and a sapphire part of the GaN template used as the seed substrate were slightly corroded.

Comparative Example 3

Figure 8:
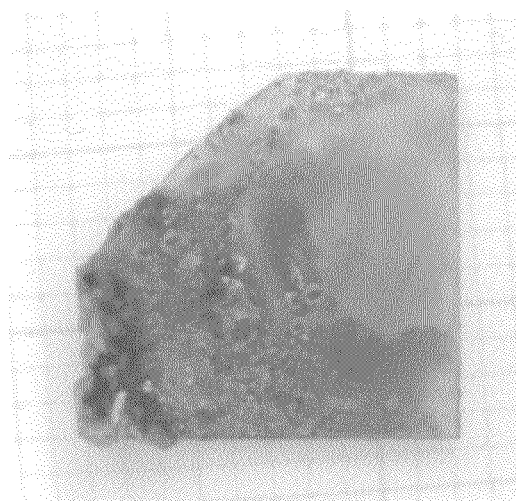
FIG. 8 is a photograph showing an exterior appearance of GaN single crystals in Comparative Example 3 where calcium is added.

GaN single crystals were grown in the manner similar to that of Example 1, except that instead of adding Ba, 0.1 mol % of Ca was added with respect to 100 mol % of Na. The obtained GaN single crystals were almost identical in shape to the template, but slightly larger than the template. The thickness was approximately 0.6 mm. Although the color was mostly dark gray, the crystals were transparent. Neither cracks nor inclusion of other types of crystal macro defects were found. A photograph of the GaN single crystals is shown in FIG. 8.

Figure 9:
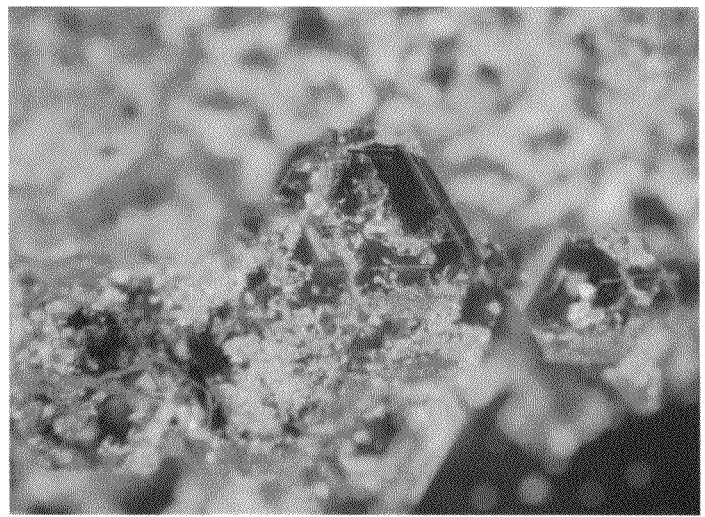
FIG. 9 is a fluorescence micrograph of the GaN single crystals in Comparative Example 3 where calcium is added.

When the crystals were examined for impurity band emission by means of the fluorescence microscope as in the case of Example 1, emission of blue light was observed (FIG. 9). Further, the alumina crucible was heavily corroded, and the thickness of the sapphire part of the GaN template used as the seed substrate was thinned out. Accordingly, it was confirmed that the sapphire part was dissolved.

Comparative Example 4

GaN single crystals were grown in the manner similar to that of Example 1. However, a tungsten crucible was used in place of the alumina crucible. Further, 0.66 g of $NaN_3$ (Na: 0.010 mol), 1.2 g of metallic Ga (Ga: 0.017 mol), and 16 mg of metallic Ba (Ba: 0.117 mmol) were used. When Na is taken as 100 mol %, Ga is 170 mol %, and Ba is 1.17 mol %. The growth temperature was set to 750° C. No seed crystal was used. Although microcrystals of GaN having the size of approximately 1 mm were deposited on a wall surface of the crucible, the microcrystals were black and not transparent.

Although the specific embodiments of the present invention have been described, the present invention is not limited thereto, and various changes or modifications may be made in the invention without departing from the scope of the invention.

The invention claimed is:

1. A melt composition for growing a gallium nitride single crystal by flux method in an alumina container at a growth temperature of 850° C. to 1000° C., said melt composition comprising gallium, sodium and barium, wherein a content of barium is 0.05 to 0.3 mol % with respect to 100 mol % of sodium.

2. The melt composition of claim 1, wherein a content of gallium is 20 to 40 mol % with respect to 100 mol % of sodium.

* * * * *